US012805238B2

(12) United States Patent
Kuwana

(10) Patent No.: US 12,805,238 B2
(45) Date of Patent: Nov. 17, 2026

(54) WAFER CLEANING APPARATUS, PROCESSING APPARATUS, AND PROCESSING METHOD

(71) Applicant: DISCO CORPORATION, Tokyo (JP)

(72) Inventor: Kazutaka Kuwana, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 26 days.

(21) Appl. No.: 19/177,145

(22) Filed: Apr. 11, 2025

(65) Prior Publication Data

US 2025/0329553 A1 Oct. 23, 2025

(30) Foreign Application Priority Data

Apr. 23, 2024 (JP) ................................ 2024-069597

(51) Int. Cl.
*H10P 72/00* (2026.01)

(52) U.S. Cl.
CPC ................................ *H10P 72/0412* (2026.01)

(58) Field of Classification Search
CPC ......................... H10P 72/0412; H10P 72/0414
See application file for complete search history.

(56) References Cited

U.S. PATENT DOCUMENTS 4,370,356 A * 1/1983 Bok .......................... G03F 7/16
118/DIG. 2
5,270,079 A * 12/1993 Bok .......................... B05C 9/02
427/434.2
5,339,842 A * 8/1994 Bok .......................... B08B 3/12
134/155
5,601,655 A * 2/1997 Bok ........................ B08B 3/123
134/1
5,660,642 A * 8/1997 Britten .................... B08B 3/041
134/32
5,933,902 A * 8/1999 Frey .......................... B08B 1/30
15/97.1
6,021,789 A * 2/2000 Akatsu ...................... B08B 3/12
134/57 R
6,082,377 A * 7/2000 Frey .......................... B08B 1/30
15/97.1

(Continued)

FOREIGN PATENT DOCUMENTS

EP 1583136 A1 * 10/2005 .......... H10P 72/0414
EP 1583137 A2 * 10/2005 .......... H10P 72/0408

(Continued)

*Primary Examiner* — Jason Y Ko
(74) *Attorney, Agent, or Firm* — Greer Burns & Crain Ltd.

(57) ABSTRACT

A wafer cleaning apparatus includes: a holding pad configured to hold a top surface of a wafer; a cleaning mechanism configured to clean part of an under surface of the wafer held on the holding pad; and a moving mechanism configured to relatively move the holding pad and the cleaning mechanism in a horizontal direction, wherein the cleaning mechanism includes: a cleaning tank; a cleaning water supply configured to supply cleaning water to the cleaning tank; and an ultrasonic oscillator arranged at the cleaning tank and configured to propagate ultrasonic oscillation to the cleaning water; and wherein the moving mechanism is configured to move the holding pad holding the wafer, whose under surface is partially in contact with the cleaning water raised higher than an opening of the cleaning tank, so as to clean the under surface of the wafer.

6 Claims, 5 Drawing Sheets

(56) References Cited

U.S. PATENT DOCUMENTS

| | | | | |
|---|---|---|---|---|
| 6,261,377 | B1 * | 7/2001 | Mertens | H10P 72/0406 134/32 |
| 6,539,952 | B2 * | 4/2003 | Itzkowitz | B08B 3/12 134/1 |
| 6,726,848 | B2 * | 4/2004 | Hansen | B08B 3/048 216/99 |
| 7,045,018 | B2 * | 5/2006 | Ravkin | H10P 72/0406 134/32 |
| 7,293,571 | B2 * | 11/2007 | Woods | B08B 3/02 134/102.3 |
| 7,614,411 | B2 * | 11/2009 | Korolik | H10P 72/0406 134/102.1 |
| 2005/0132515 | A1 * | 6/2005 | Boyd | H10P 72/0412 15/77 |
| 2005/0155629 | A1 * | 7/2005 | Ravkin | H10P 72/0406 134/6 |
| 2005/0217135 | A1 * | 10/2005 | O'Donnell | H10P 70/20 34/310 |
| 2005/0217703 | A1 * | 10/2005 | O'Donnell | B05C 11/1039 134/21 |
| 2006/0191560 | A1 * | 8/2006 | Ravkin | B08B 1/34 134/94.1 |
| 2010/0015731 | A1 * | 1/2010 | Yun | C23C 16/401 118/728 |

FOREIGN PATENT DOCUMENTS

| | | | | | |
|---|---|---|---|---|---|
| EP | 1583138 | A1 | * | 10/2005 | H10P 72/0418 |
| JP | 2004-363368 | A | | 12/2004 | |
| JP | 2020-115496 | | * | 7/2020 | |
| JP | 2020-115496 | A | | 7/2020 | |
| JP | 2021-034349 | | * | 3/2021 | |
| JP | 2021-034439 | A | | 3/2021 | |
| JP | 2023-084785 | A | | 6/2023 | |
| WO | WO-2004030051 | A2 | * | 4/2004 | H10P 52/00 |
| WO | WO-2005096910 | A1 | * | 10/2005 | H10P 72/0414 |

* cited by examiner

WAFER CLEANING APPARATUS, PROCESSING APPARATUS, AND PROCESSING METHOD

CROSS-REFERENCE TO RELATED APPLICATION

This application claims priority from Japanese Patent Application No. 2024-069597 filed with the Japan Patent Office on Apr. 23, 2024, the entire content of which is hereby incorporated by reference.

BACKGROUND ART

1. Technical Field

The present invention relates to a wafer cleaning apparatus configured to clean an under surface of a wafer held on a holding pad, a processing apparatus having such a wafer cleaning apparatus, and a processing method implemented by using such a processing apparatus.

2. Related Art

When a wafer is ground by grinding stones to achieve a uniform thickness, the wafer before grinding may have foreign matter such as dust (hereinafter, "particles") adhered thereto. When such a wafer is held on the chuck table, particles are present between the wafer and the holding surface of the chuck table. Therefore, during grinding, portions where particles are present become thinner, making it difficult to achieve a uniform thickness of the ground wafer.

To address this, Japanese Patent Application Laid-Open No. 2021-034439 proposes a cleaning apparatus which cleans the under surface of the wafer by bringing a rotatable roll sponge into contact with the under surface of the wafer before the wafer is held by the chuck table, and removing the particles adhered to the under surface of the wafer by the roll sponge.

The above cleaning apparatus, however, causes a problem that the under surface of the wafer may be abraded by the particles adhered to the roll sponge. Given this, Japanese Patent Application Laid-Open No. 2020-115496 proposes a cleaning apparatus which houses a brush in a cleaning tank and causes a raised surface of cleaning water stored in the cleaning tank, which is raised by its surface tension, to come into contact with the under surface of the wafer. In this way, the particles adhered to the under surface of the wafer are removed. Further, Japanese Patent Application Laid-Open No. 2004-363368 and Japanese Patent Application Laid-Open No. 2023-084785 propose a cleaning apparatus that removes the particles adhered to the under surface of the wafer without contact by using ultrasonic oscillation of cleaning water.

SUMMARY

However, the cleaning apparatuses proposed by the above-mentioned Japanese Patent Application Laid-Open No. 2020-115496, Japanese Patent Application Laid-Open No. 2020-115496, Japanese Patent Application Laid-Open No. 2004-363368, and Japanese Patent Application Laid-Open No. 2023-084785 house a brush and the entire object to be cleaned, such as a wafer, in the cleaning tank. This requires a large cleaning tank, resulting in a larger cleaning apparatus. For this reason, it is difficult to install the cleaning apparatus in a processing apparatus in a compact manner, leading to an increase in the size of the processing apparatus.

The present invention was made in view of the above problem. An object of the present invention is to provide a wafer cleaning apparatus that can be installed in a compact manner, a processing apparatus having such a wafer cleaning apparatus, and a processing method implemented in the processing apparatus.

To achieve the above object, a wafer cleaning apparatus related to one aspect of the present invention includes: a holding pad configured to hold a top surface of a wafer; a cleaning mechanism configured to clean part of an under surface of the wafer held on the holding pad; and a moving mechanism configured to relatively move the holding pad and the cleaning mechanism in a horizontal direction, wherein the cleaning mechanism includes: a cleaning tank having an opening in its top surface and configured to store cleaning water therein so that the cleaning water rises higher than the opening; a cleaning water supply configured to supply cleaning water to the cleaning tank; and an ultrasonic oscillator arranged at the cleaning tank and configured to propagate ultrasonic oscillation to the cleaning water; and wherein the moving mechanism is configured to move the holding pad holding the wafer, whose under surface is partially in contact with the cleaning water raised higher than the opening of the cleaning tank, so as to clean the under surface of the wafer.

Further, a processing apparatus related to one aspect of the present invention includes: a chuck table configured to hold a wafer; a processing unit configured to process a wafer held on the chuck table; and the above-described wafer cleaning apparatus, wherein the wafer cleaning apparatus is configured to clean at least one of the under surface of a wafer held on the holding pad before processing and the under surface of a wafer held on the holding pad after processing by the processing unit.

Further, a processing method related to one aspect of the present invention includes processing of a wafer by using the above-described processing apparatus, wherein the processing of the wafer comprises a processing step of processing the wafer held on the chuck table by the processing unit, and at least one of a pre-processing cleaning step of cleaning the under surface of the wafer held on the holding pad by the wafer cleaning apparatus before the processing step and a post-processing cleaning step of holding the wafer having been processed in the processing step on the holding pad and cleaning the under surface of the wafer by the wafer cleaning apparatus.

According to an aspect of the present invention, a part of the wafer held on the holding pad contacts the cleaning water stored in the cleaning tank. Further, the contact of the wafer with the cleaning water extends across the entire wafer due to the movement of the wafer by the moving mechanism. In other words, without immersing the entire wafer held on the holding pad in the cleaning water inside the cleaning tank, the under surface of the wafer is cleaned by implementing a sweeping process across the wafer by the cleaning tank. Therefore, the cleaning tank can be configured to be small and compact. As a result, the wafer cleaning apparatus can be installed in a compact manner, in the processing apparatus.

DETAILED DESCRIPTION

Figure 1:
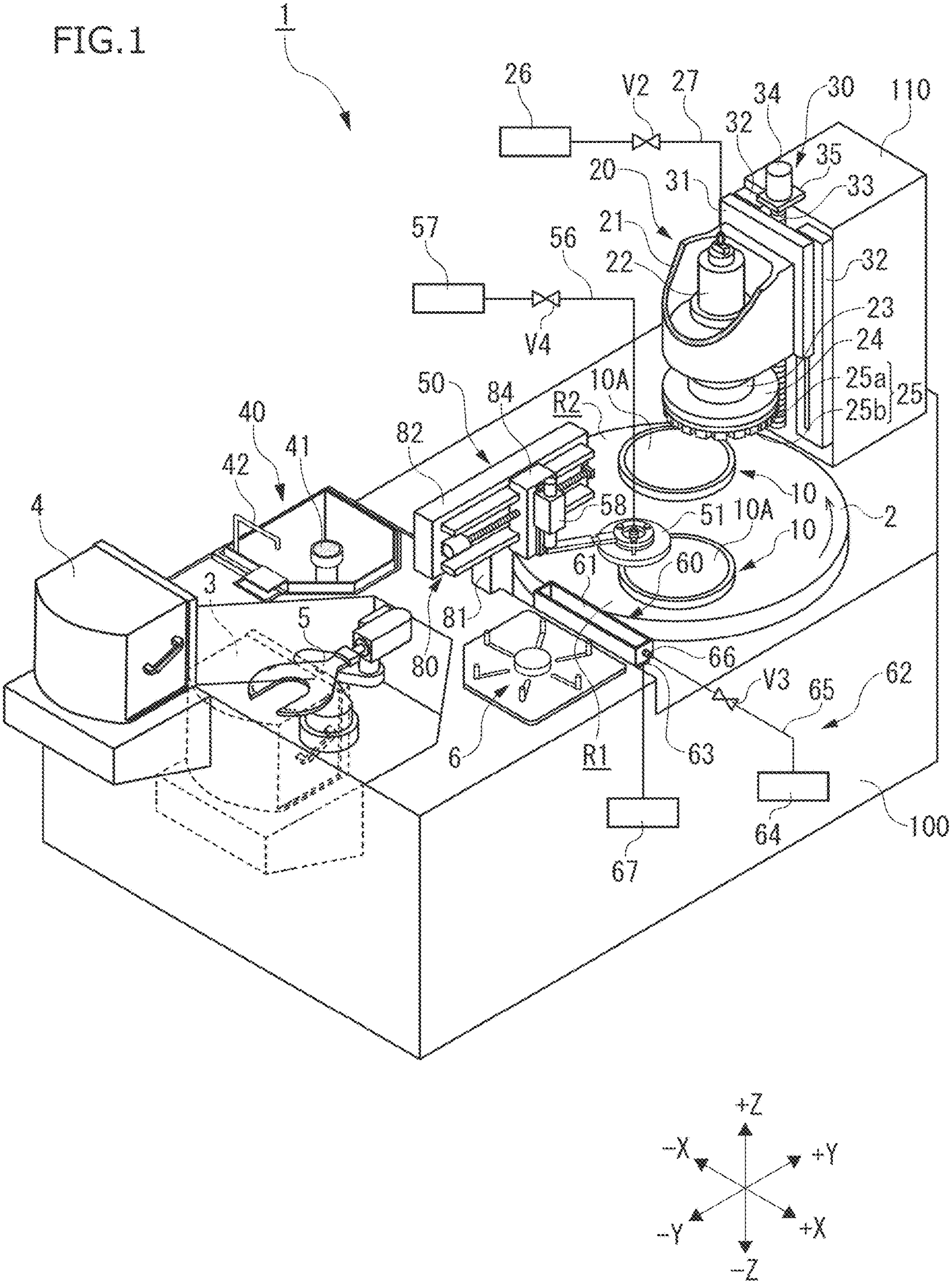
FIG. 1 is a perspective view of a grinding apparatus having a wafer cleaning apparatus according to an embodiment of the present invention.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Embodiments of the present invention will be described below with reference to attached drawings.

Configuration of Grinding Apparatus

First, the overall configuration of a grinding apparatus having a wafer cleaning apparatus according to the present embodiment will be described with reference to FIG. 1. Note that, in the following description, the directions indicated by the arrows in FIG. 1 are defined as the X direction (left-right direction), the Y direction (front-rear direction), and the Z direction (up-down direction).

The grinding apparatus 1 shown in FIG. 1 is for grinding a disc-shaped wafer W (see FIG. 2 to FIG. 5). The grinding apparatus 1 includes, as its main components, two chuck tables 10 arranged on a rotatable disk-shaped turntable 2, a grinding unit 20 configured to grind the wafer W held on each chuck table 10, a cleaning unit 40 configured to clean the top surface (ground surface) of the wafer W after grinding, and a wafer cleaning apparatus 50 according to the present embodiment configured to clean the under surface of the wafer W (for example, the entire under surface of the wafer W).

Note that the grinding apparatus 1 includes, as other components, a first cassette 3 and a second cassette 4 arranged side by side along the X direction (left-right direction) in the-Y directional end portion (front end portion) of the base 100, a loading/unloading robot 5 arranged near the first cassette 3, and an alignment table 6 arranged near the loading/unloading robot 5. The first cassette 3 stores a plurality of wafers W before grinding. The second cassette 4 houses a plurality of wafers W that have been ground and cleaned by the cleaning unit 40.

In the present embodiment, the wafer W is made of a monocrystalline silicon base material. The wafer W, however, may be made of a polycrystalline silicon base material. In place of silicon (Si), materials used for wafers W include silicon carbide (SiC), glass, ceramics, sapphire ($Al_2O_3$), and gallium arsenide (GaAs) and the like.

Next, the following describes the main components of the grinding apparatus 1, which are the chuck tables 10, the grinding unit 20, the cleaning unit 40, and the wafer cleaning apparatus 50 of this embodiment.

(Chuck Tables)

The turntable 2 intermittently rotates about a central axis extending in the Z direction. On this turntable 2, two chuck tables 10 are rotatably arranged. The two chuck tables 10 are each a disc-shaped member and are arranged at an equal angular pitch (180° pitch) in the circumferential direction on the turntable 2. These chuck tables 10 sequentially move between a wafer loading/unloading region R1 and a grinding region R2 by the intermittent half-rotation (180° rotation) of the turntable 2. The chuck tables 10 rotate (on their own axes) at a predetermined speed about the rotation axis CL1 (see FIG. 5) by a not-shown rotation mechanism.

Figure 5:
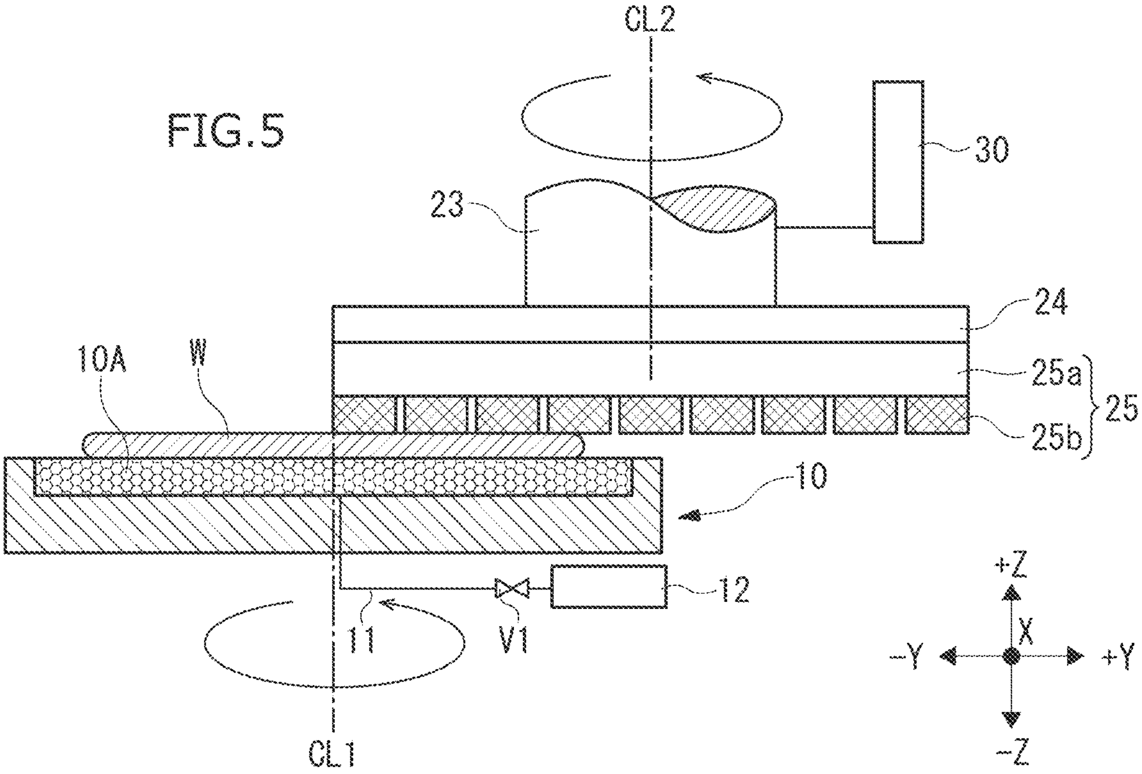
FIG. 5 is a partial side view showing a grinding process of a wafer.

Further, each chuck table 10 has, in its central upper portion, a disc-shaped porous member 10A made of porous ceramic and the like, as shown in FIG. 5. The top surface of each porous member 10A forms a holding surface that holds the wafer W by suction. The porous members 10A are selectively connected to a suction source 12, such as a vacuum pump, via piping 11, as shown in FIG. 5. In other words, the porous members 10A are selectively connected to the suction source 12, by opening and closing a shutoff valve V1 provided in the piping 11.

(Grinding unit)

The grinding unit 20 is an example of a processing unit. As shown in FIG. 1, the grinding unit 20 includes: a holder 21 that is open at the top; a spindle motor 22 serving as a rotary drive source, fixed to the holder 21 in a standing posture; a spindle 23 rotationally driven by the spindle motor 22; a disc-shaped mount 24 attached to the lower end of the spindle 23; and a grinding wheel 25 detachably mounted on the under surface of the mount 24. The grinding wheel 25 includes a disc-shaped base 25*a* and a plurality of grinding stones 25*b* annularly arranged and attached to the under surface of the base 25*a*.

The grinding unit 20 is capable of moving up and down along the Z direction (up and down directions) by a vertical movement mechanism 30. This vertical movement mechanism 30 is arranged on the end surface (front surface) of a rectangular box-shaped column 110 in the −Y direction. The column 110 is set up in a standing position on the +Y directional end portion (rear end portion) of the top surface of the base 100 and extends in the vertical direction. The vertical movement mechanism 30 moves a rectangular plate-like elevation plate 31, which is attached to the rear surface of the holder 21, up and down in the Z direction along a pair of left and right guide rails 32, together with the holder 21, the spindle motor 22 held by the holder 21, and the grinding wheel 25. The pair of left and right guide rails 32 are arranged in parallel on the front surface of the column 110 so as to extend in the vertical direction.

Between the pair of left and right guide rails 32, a rotatable ball screw 33 is set up in a standing position along the Z direction (up and down directions). The upper end of the ball screw 33 is connected to a motor 34 serving as a drive source and capable of rotating forward and backward. The motor 34 is attached to the ball screw 33 in a standing posture via a rectangular plate-like bracket 35 mounted on the top surface of the column 110. Further, the lower end of the ball screw 33 is rotatably supported by the column 110. This ball screw 33 is threadedly engaged with a nut (not shown) that protrudes horizontally rearward (in the +Y direction) from the rear surface of the elevation plate 31.

Therefore, by activating the motor 34 and rotating the ball screw 33 forward and backward, the elevation plate 31, having a nut member (not shown) in threaded-engagement with the ball screw 33, moves up and down along the Z direction together with the grinding unit 20.

Furthermore, during the grinding process of the wafer W by the grinding unit 20, grinding water is supplied from a grinding water supply source 26 to the contact area (grinding area) between the grinding stones 25*b* and the wafer W. In other words, the grinding water supply source 26 is connected to a supply passage (not shown) in the spindle motor 22 via piping 27. This supply passage is formed to extend in the up and down directions along the rotation axis of the spindle motor 22 of the grinding unit 20. The supply passage formed in the spindle motor 22 is connected to supply passages (not shown) formed in the spindle 23, the mount 24 and the base 25*a* of the grinding wheel 25. The grinding water supplied from the grinding water supply source 26 is sprayed toward the inside of the grinding stones 25*b* from a plurality of nozzles (not shown) formed in the base 25*a*. Pure water is suitably used as the grinding water. The piping 27 has a shutoff valve V2.

(Cleaning unit)

The cleaning unit 40 cleans the ground surface (top surface) of the wafer W ground by the grinding unit 20, and removes grinding debris and the like adhering to the grind ground surface. The cleaning unit 40 includes a spinner table 41 that holds and rotates the wafer W after the grinding, and a cleaning water nozzle 42 that sprays cleaning water towards the top surface (ground surface) of the wafer W. Pure water is suitably used for the cleaning water.

(Wafer Cleaning Apparatus)

The wafer cleaning apparatus 50 of the present embodiment is configured to clean the under surface of the wafer W (for example, the entire under surface of the wafer W) both after taking out a wafer W to be ground from the first cassette 3 prior to transporting that wafer W to the chuck table 10, and after the wafer W is ground by the grinding unit 20. As shown in FIG. 1, the wafer cleaning apparatus 50 is arranged substantially in the middle of the base 100 relative to the Y direction (front-rear directions). This wafer cleaning apparatus 50 includes: a disc-shaped holding pad 51 configured to hold the top surface of the wafer W; a cleaning mechanism 60 configured to clean the under surface of the wafer W held on the holding pad 51; and a moving mechanism configured to move the holding pad 51 in a horizontal direction relative to the cleaning mechanism 60.

The cleaning mechanism 60 includes: an elongated cleaning tank 61; a cleaning water supply 62 configured to supply cleaning water to the cleaning tank 61; and an ultrasonic oscillator 63 installed on the under surface of the cleaning tank 61. The cleaning tank 61 is arranged along the X direction on the base 100, between the alignment table 6 and the turntable 2 in the Y direction. The cleaning tank 61 is formed as a rectangular container with an open top and an elongated shape in the X direction. The cleaning water supply 62 includes a cleaning water supply source 64 that supplies cleaning water to the cleaning tank 61. The cleaning water supply source 64 and the cleaning tank 61 are connected via piping 65. One end of this piping 65 is connected to a plug 66 attached to a +X directional end surface of the cleaning tank 61. The piping 65 has a shutoff valve V3. Pure water is suitably used for the cleaning water.

The holding pad 51 is capable of swinging within a horizontal plane by a later-described swing mechanism 70 (see FIG. 2) and moving horizontally along the Y direction by a later-described Y-axis moving mechanism 80. The cleaning tank 61 is arranged along the X direction, which is a direction intersecting (perpendicularly or substantially perpendicularly) with a motion path of the holding pad 51, that is, an arc-shaped swing motion path about a swing shaft 52 (see FIG. 2) and a linear motion path along the Y direction. The cleaning tank 61 extends along the X direction for a length L1 that is equal to or longer than the diameter ϕD of the wafer W held on the holding pad 51 (i.e., L1≥ϕD, see FIG. 4).

The ultrasonic oscillator 63 includes a rectangular plate-like piezoelectric element that is elongated in the X direction and attached to the under surface of the cleaning tank 61. The ultrasonic oscillator 63 is electrically connected to a power supply 67 configured to apply high-frequency power to the ultrasonic oscillator 63.

Figure 2:
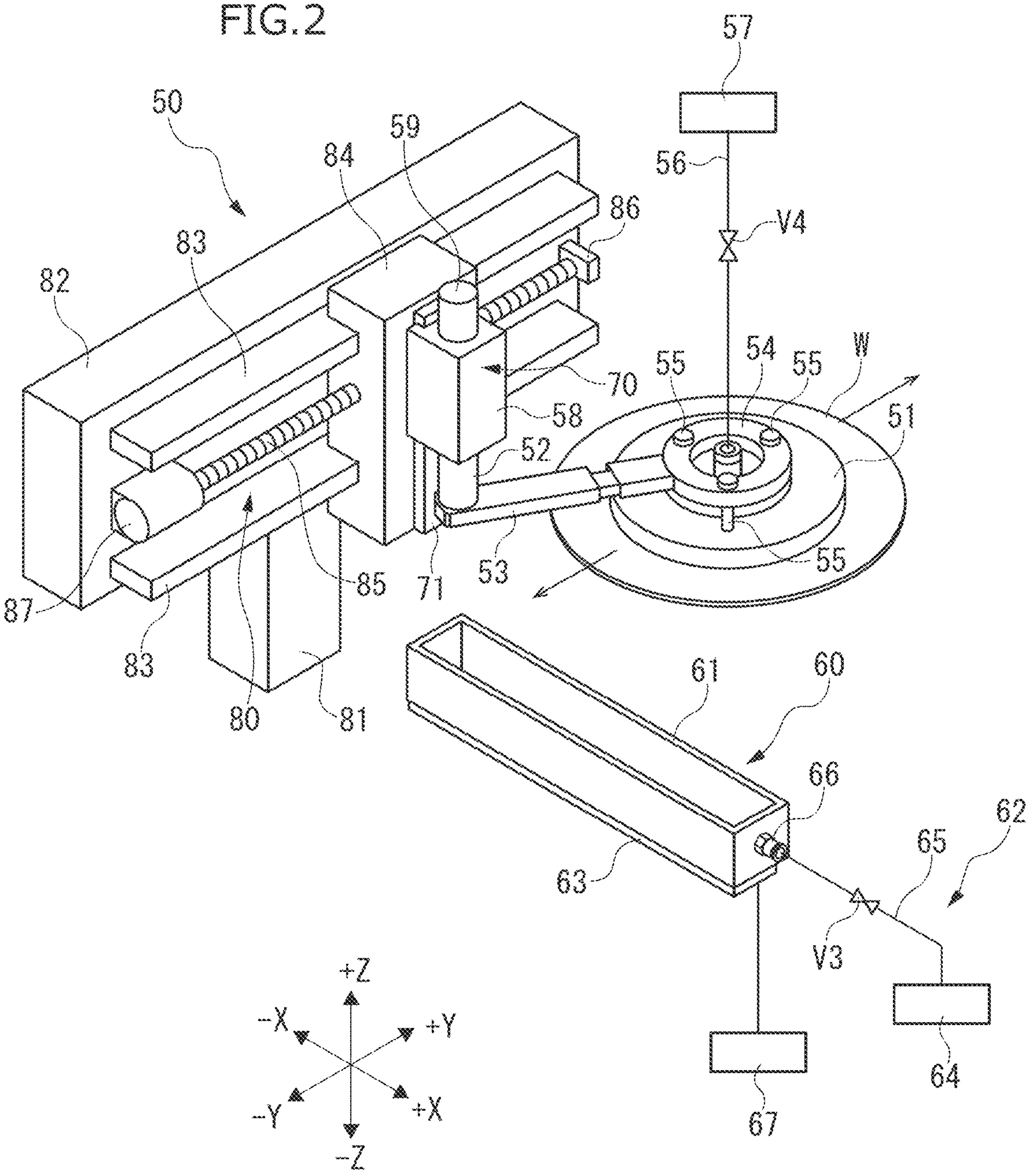
FIG. 2 is a perspective view of the wafer cleaning apparatus related to the embodiment of the present invention.

Further, the holding pad 51 is a circular member, and is attached to a distal end of the arm 53 as shown in detail in FIG. 2. The arm 53 extends horizontally, and is attached to a lower end of the vertically extending swing shaft 52. More specifically, a ring-shaped holding ring 54 is attached to the distal end of the arm 53. The holding ring 54 suspends and supports the holding pad 51 via three pins 55. Note that the under surface of the holding pad 51 forms the holding surface. This holding surface is connected to a suction source 57 such as a vacuum pump via piping 56. To this piping 56, a shutoff valve V4 is attached. Therefore, by opening and closing the shutoff valve V4, the suction surface of the holding pad 51 is selectively connected to the suction source 57.

As shown in detail in FIG. 2, the swing shaft 52 extending in the vertical direction passes through an elevation block 58. The swing shaft 52 is rotatable by a motor 59 attached to the top surface of the elevation block 58. Thus, the motor 59 and the swing shaft 52 constitute the swing mechanism 70. When the motor 59 is activated and the swing shaft 52 rotates about its central axis, the arm 53 attached to the lower end of the swing shaft 52, the holding pad 51 supported by the distal end of the arm 53, and the wafer W held on the holding pad 51 by suction (described later) swing within a horizontal plane about the swing shaft 52.

Figure 3:
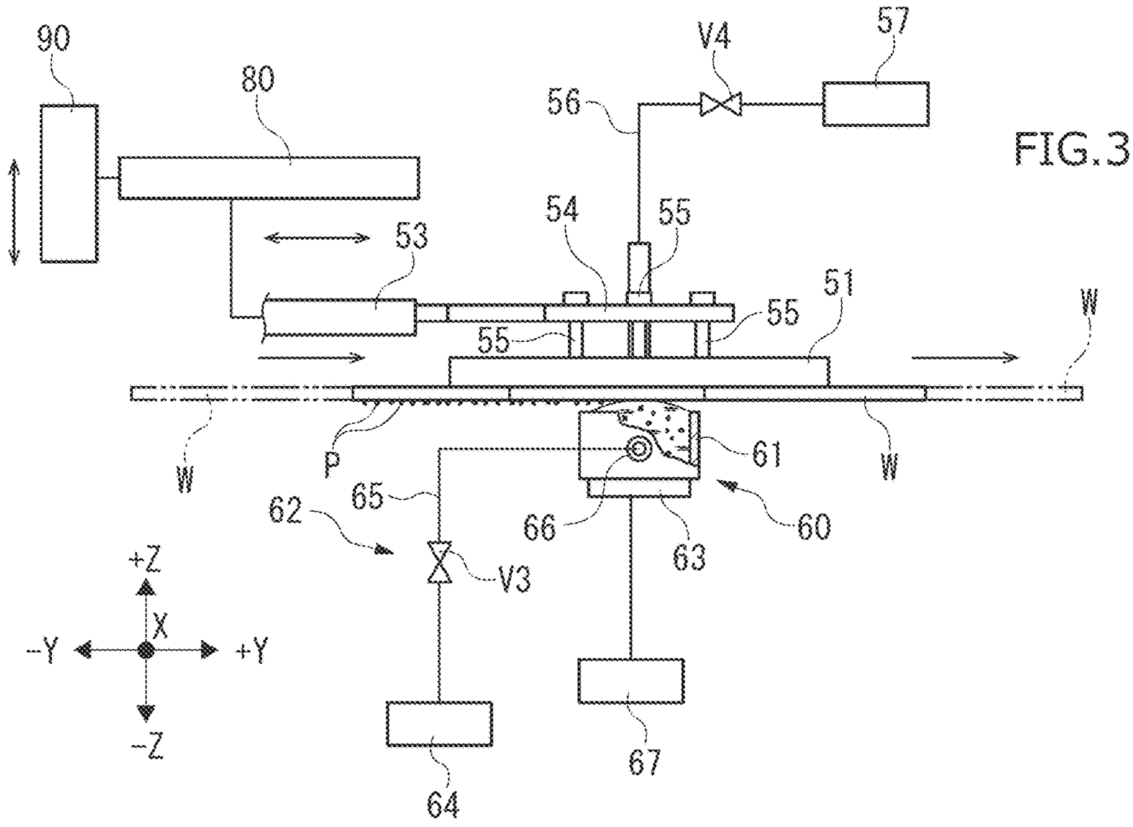
FIG. 3 is a broken side view showing a method for cleaning a wafer using a wafer cleaning apparatus according to the embodiment of the present invention.
Figure 4:
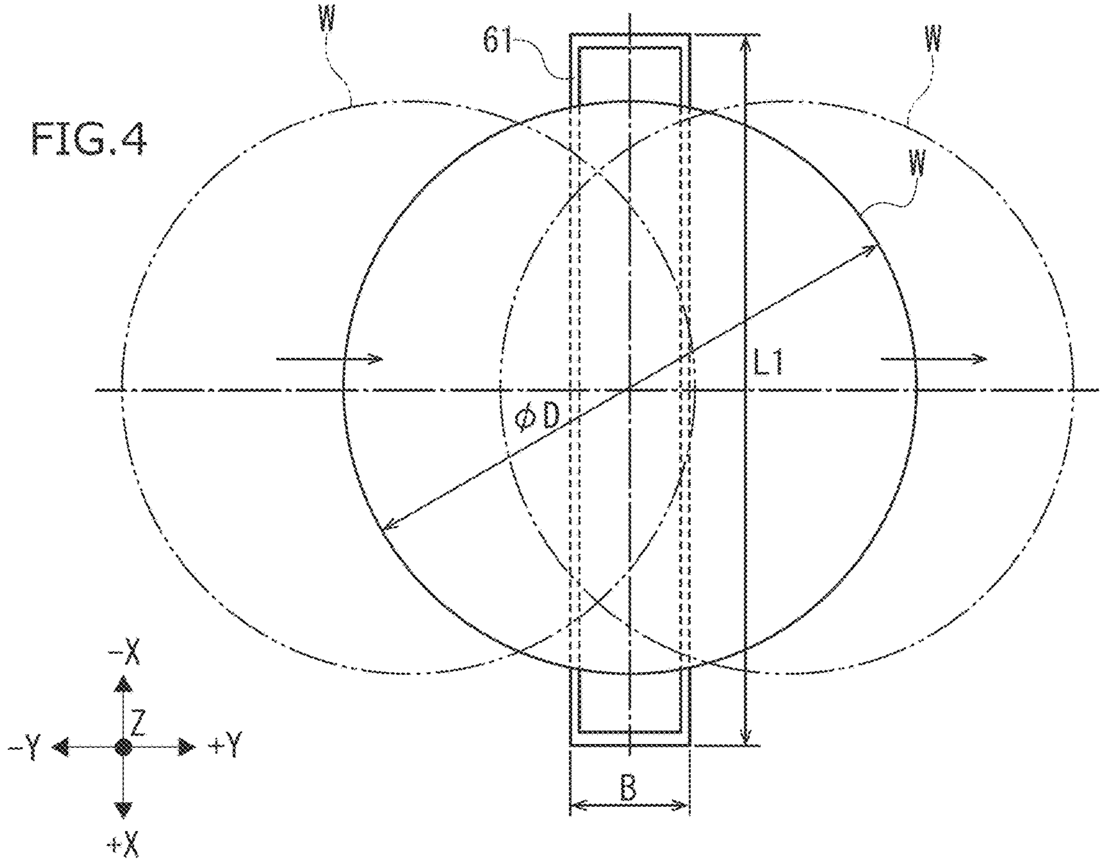
FIG. 4 is a plan view showing a method for cleaning a wafer using a wafer cleaning apparatus according to the embodiment of the present invention.

Further, the elevation block 58, together with the swing shaft 52, the arm 53, and the holding pad 51, is capable of moving up and down in the Z direction along the guide rails 71 extending in the vertical direction, by a Z-axis movement mechanism 90 (see FIG. 3). Note that the Z-axis movement mechanism 90 includes a known ball screw mechanism.

Meanwhile, the moving mechanism moves, relatively to the cleaning mechanism 60, the holding pad 51 and the wafer W held thereon by suction in a horizontal direction. This moving mechanism includes the swing mechanism 70 and the Y-axis moving mechanism 80. The Y-axis moving mechanism 80 is provided on a rectangular support plate 82, as shown in FIG. 1. The support plate 82 is supported by a column 81 substantially in the middle relative to the Y direction of the base 100, so as to extend in the vertical direction. As shown in detail in FIG. 2, the Y-axis moving mechanism 80 provided on the support plate 82 includes a pair of upper and lower guide rails 83 and a rectangular block-shaped slider 84. The pair of guide rails 83 are arranged on a +X directional end surface of the support plate 82 so as to extend parallel to each other in the Y direction. The slider 84 is capable of moving in the Y direction along the guide rails 83.

The slider 84 supports the elevation block 58 capable of moving up and down in the Z direction along the guide rails 83. Therefore, the swing mechanism 70, the arm 53, the holding pad 51, and the like are able to move together with the slider 84 in the Y direction.

In the Y-axis moving mechanism 80, a rotatable ball screw 85 is arranged between the upper and lower guide rails 83 along the Y direction. The ball screw 85 is inserted into and in threaded engagement with the slider 84. One end of the ball screw 85 is rotatably supported by the support plate 82 via a bearing 86. The other end of the ball screw 85 is coupled with a motor 87 serving as a drive source. Therefore, by activating the motor 87 and rotating the ball screw 85 forward and backward, the slider 84, having the ball screw 85 inserted therethrough and in threaded engagement, is able to move in the Y direction together with the elevation block 58 constituting the Z-axis movement mechanism 90, the holding pad 51, and the like. As a result, the holding pad 51 and the wafer W held thereon are able to swing within a horizontal plane, as well as move in the Y direction.

Operation of Grinding Apparatus

Next, operations of the grinding apparatus 1 configured as described above will be described.

In grinding of a wafer W by the grinding apparatus 1, an unprocessed wafer W is taken out by the loading/unloading robot 5 shown in FIG. 1 from the first cassette 3 and temporarily placed on the alignment table 6. Then, the wafer W is aligned (centered) on the alignment table 6. The aligned wafer W is held by the holding pad 51 by suction, and transported to the chuck table 10 located in the wafer loading/unloading region R1. During this transportation process, the entire under surface of the wafer W is cleaned by the wafer cleaning apparatus 50 of the present embodiment. This removes the particles P (see FIG. 3) adhered to the under surface of the wafer W (pre-processing cleaning step).

That is, after the alignment (centering) of the wafer W is performed on the alignment table 6, the top surface of the wafer W is held by suction on the holding pad 51. At this time, the shutoff valve V4 is opened, and the holding surface (under surface) of the holding pad 51 is connected to the suction source 57 via the piping 56. This generates a negative pressure on the holding surface, and this negative pressure draws the wafer W, resulting in the wafer W being held by suction onto the holding surface of the holding pad 51, as shown in FIG. 2 and FIG. 3.

In the wafer cleaning apparatus 50, the cleaning tank 61 is filled with the cleaning water supplied from the cleaning water supply source 64. The surface of the cleaning water is raised into an arc shape due to its surface tension and is higher than the upper end surface of the cleaning tank 61, as shown in FIG. 3. Further, the power supply 67 applies high-frequency power to the ultrasonic oscillator 63 attached to the under surface of the cleaning tank 61, and the ultrasonic oscillator 63 causes ultrasonic oscillation of the cleaning water in the cleaning tank 61.

In this state, the holding pad 51 and the wafer W held thereon make, for example, a horizontal linear movement in the Y direction by the Y-axis moving mechanism 80 and move over the cleaning tank 61 in the Y direction perpendicular to the length direction (X direction) of the cleaning tank 61, as shown in FIG. 2 and FIG. 3; that is, the cleaning tank 61 sweeps across the under surface of the wafer W. In this way, the top surface of the cleaning water, raised due to surface tension above the cleaning tank 61, comes into contact with the under surface of the wafer W (water landing). As a result, the particles P adhered to the under surface of the wafer W are removed by the cleaning water. In this case, the cleaning water undergoes ultrasonic oscillation by the ultrasonic oscillator 63. Therefore, the particles P adhered to the under surface of the wafer W are effectively removed by the cleaning water undergoing ultrasonic oscillation.

Thus, in the wafer cleaning apparatus 50 of the present embodiment, a part of the under surface of the wafer W held on the holding pad 51 contacts the cleaning water stored in the cleaning tank 61. Further, the Y-axis moving mechanism 80 moves the holding pad 51 holding the wafer W whose under surface partially contacts the cleaning water, to clean the entire under surface of the wafer W. That is, the contact of the wafer W with the cleaning water extends across the entire under surface due to the linear movement of the holding pad 51 by the Y-axis moving mechanism 80. In other words, without immersing the entire wafer W held on the holding pad 51 in the cleaning water inside the cleaning tank 61, the entire under surface of the wafer W is cleaned by implementing a sweeping process across the wafer W by the cleaning tank 61. Therefore, the cleaning tank 61 can be configured to be small and compact. As a result, the wafer cleaning apparatus 50 can be downsized and installed in the grinding apparatus 1 in a compact manner.

That is, in the present embodiment, the movement of the wafer W over the cleaning tank 61 extends the partial contact of the under surface of the wafer W with the cleaning water, thereby covering the entire under surface of the wafer W. Therefore, the width B (see FIG. 4) of the cleaning tank 61 can be set to a minimum necessary value, allowing the cleaning tank 61 to be small and compact. As a result, the wafer cleaning apparatus 50 can be downsized and installed in the grinding apparatus 1 in a compact manner.

Note that, in the present embodiment, the wafer cleaning apparatus 50 cleans the entire under surface of the wafer W, while the holding pad 51 and the wafer W held thereon horizontally is moved in the Y direction by the Y-axis moving mechanism 80. In this regard, the sweeping process in which the wafer W passes over the cleaning tank 61 may be performed when the holding pad 51 and the wafer W held thereon move along the arc-shaped motion path about the swing shaft 52 by the swing mechanism 70. That is, the cleaning tank 61 may be arranged along the X direction intersecting (perpendicularly or substantially perpendicularly) with the arc-shaped motion path of the holding pad 51 and the wafer W, so as to extend for a length L1 equal to or longer than the diameter $\phi D$ of the wafer W (i.e., $L1 \geq \phi D$).

After the under surface of the wafer W is cleaned by the wafer cleaning apparatus 50 as described above, the wafer W held on the holding pad 51 is held by suction on the holding surface of the chuck table 10 in the wafer loading/unloading region R1 (see FIG. 1), with its cleaned under surface facing downward, as shown in FIG. 5. At this time, the shutoff valve V1 is opened, and the porous member 10A of the chuck table 10 is connected to the suction source 12 via the piping 11. This generates a negative pressure on the porous member 10A, and this negative pressure draws the wafer W, resulting in the wafer W being held by suction onto the holding surface of the chuck table 10, i.e., onto the top surface of the porous member 10A.

Thus, the wafer W is transported to the chuck table 10 in the wafer loading/unloading region R1 and held by suction on the holding surface of the chuck table 10. After that, the turntable 2 shown in FIG. 1 rotates half a turn in the direction of the arrow, moving the chuck table 10 and the wafer W held thereon to the grinding region R2, where they are positioned beneath the grinding wheel 25 of the grinding unit 20.

Then, the chuck table 10, together with the wafer W, is rotationally driven by a rotation mechanism (not show) at a predetermined speed in the direction of the arrow in the figure, about the rotation axis CL1. Further, the grinding wheel 25 of the grinding unit 20 is aligned so that the circumscribed circle of the grinding stones 25*b* passes through the center of the wafer W. In this state, the spindle motor 22 rotationally drives the grinding wheel 25 about the rotation axis CL2 at a predetermined speed.

Then, from the state described above, the vertical movement mechanism 30 descends the grinding wheel 25 by a predetermined grinding allowance to grind the top surface of the wafer W by the grinding stones 25*b* (processing step). After the top surface of the wafer W is ground, the turntable 2 shown in FIG. 1 rotates half a turn in the direction of the arrow, moving the chuck table 10 supported by the turntable 2 and the wafer W to the wafer loading/unloading region R1. In the grinding process of the wafer W, grinding water (pure water) is supplied from the grinding water supply source 26 to the contact area (grinding area) between the wafer W and grinding stone 25*b*. In this way, the grinding water dissipates friction heat generated at the contact area, thus suppressing a rise in the temperature of the contact area. Further, the grinding water washes away the grinding debris produced by the grinding.

After the wafer W is ground as mentioned above, the wafer W on the chuck table 10 is held by suction onto the holding pad 51 and transported to the cleaning unit 40. During the transportation process of the wafer W to the cleaning unit 40, the entire under surface of the wafer W is cleaned by the wafer cleaning apparatus 50 in the same manner as described above. This removes grinding debris adhered to the under surface of the wafer W (post-processing cleaning step).

The wafer W, whose under surface has been cleaned by the wafer cleaning apparatus 50, is transported by the holding pad 51 to the cleaning unit 40 as shown in FIG. 1, is passed onto the spinner table 41, and is held on the holding surface of the spinner table 41. In this state, the spinner table 41 rotates at high speed together with the wafer W, while cleaning water is sprayed to the top surface of the wafer W from the cleaning water nozzle 42. As a result, grinding debris adhered to the top surface of the wafer W is washed away and removed by the cleaning water.

As mentioned above, the wafer W whose top surface has been cleaned by the cleaning unit 40 is passed from the spinner table 41 to the loading/unloading robot 5. The loading/unloading robot 5 transports the wafer W to the second cassette 4 and stores the same in the second cassette 4. This completes a series of grinding processing for the wafer W.

Wafer Cleaning Apparatus of Another Embodiment

Next, a wafer cleaning apparatus according to another embodiment of the present invention will be described with reference to FIG. 6 to FIG. 8. Note that, in FIG. 6 to FIG. 8, the same reference symbols are given to components identical to those shown in FIG. 2 to FIG. 4, and descriptions for those components will be omitted.

Figure 6:
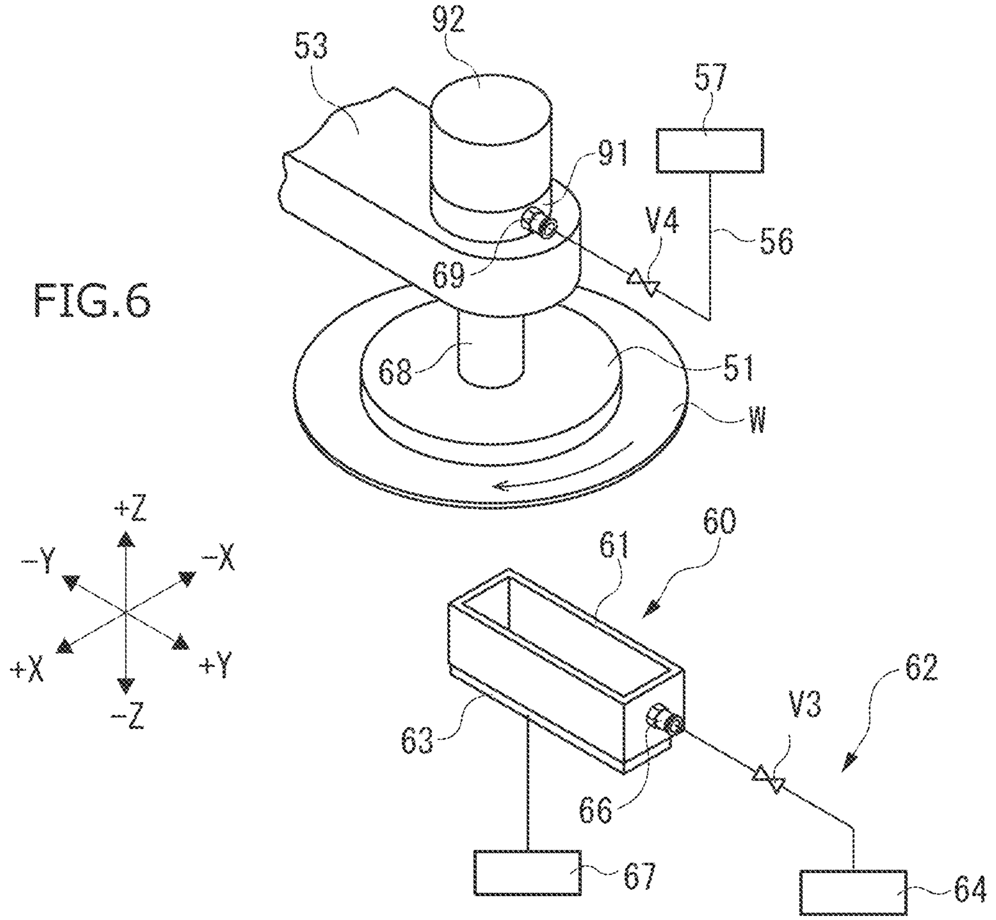
FIG. 6 is a partial perspective view of the wafer cleaning apparatus related to another embodiment of the present invention.
Figure 7:
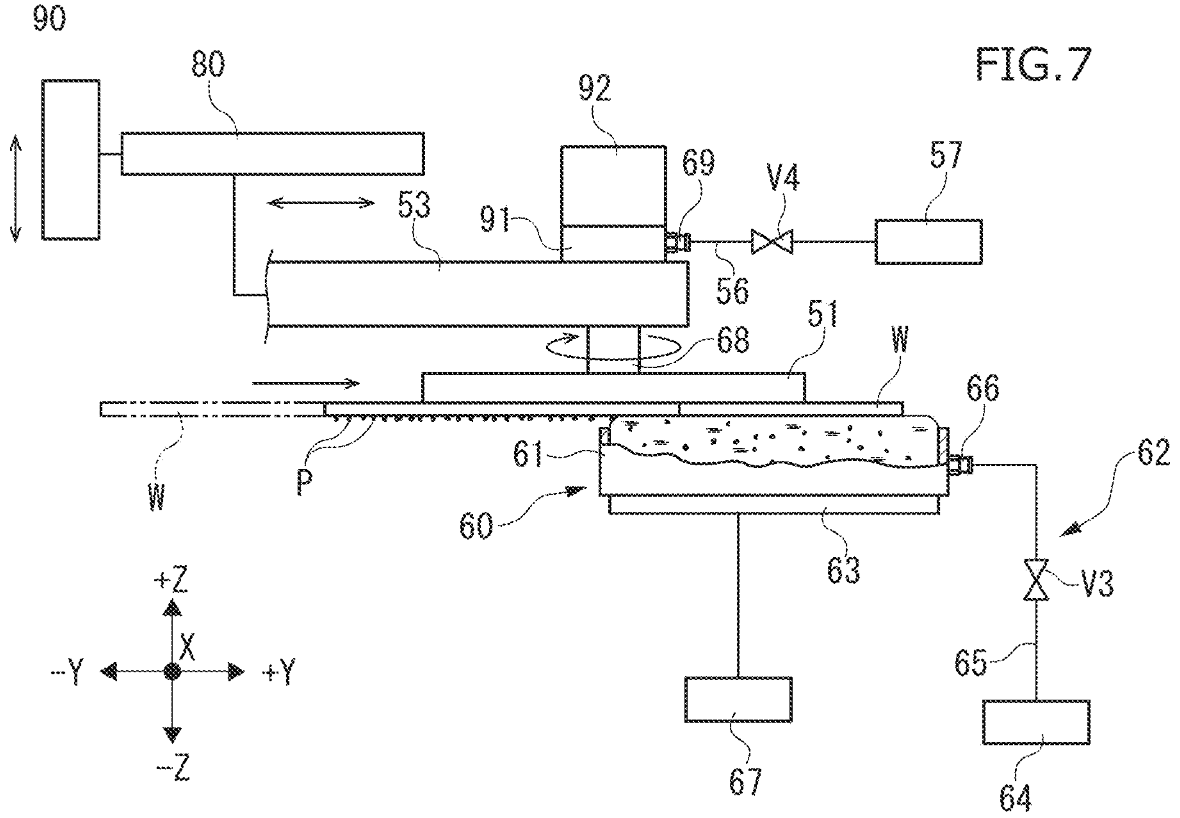
FIG. 7 is a broken side view showing a method for cleaning a wafer using a wafer cleaning apparatus according to the other embodiment of the present invention.
Figure 8:
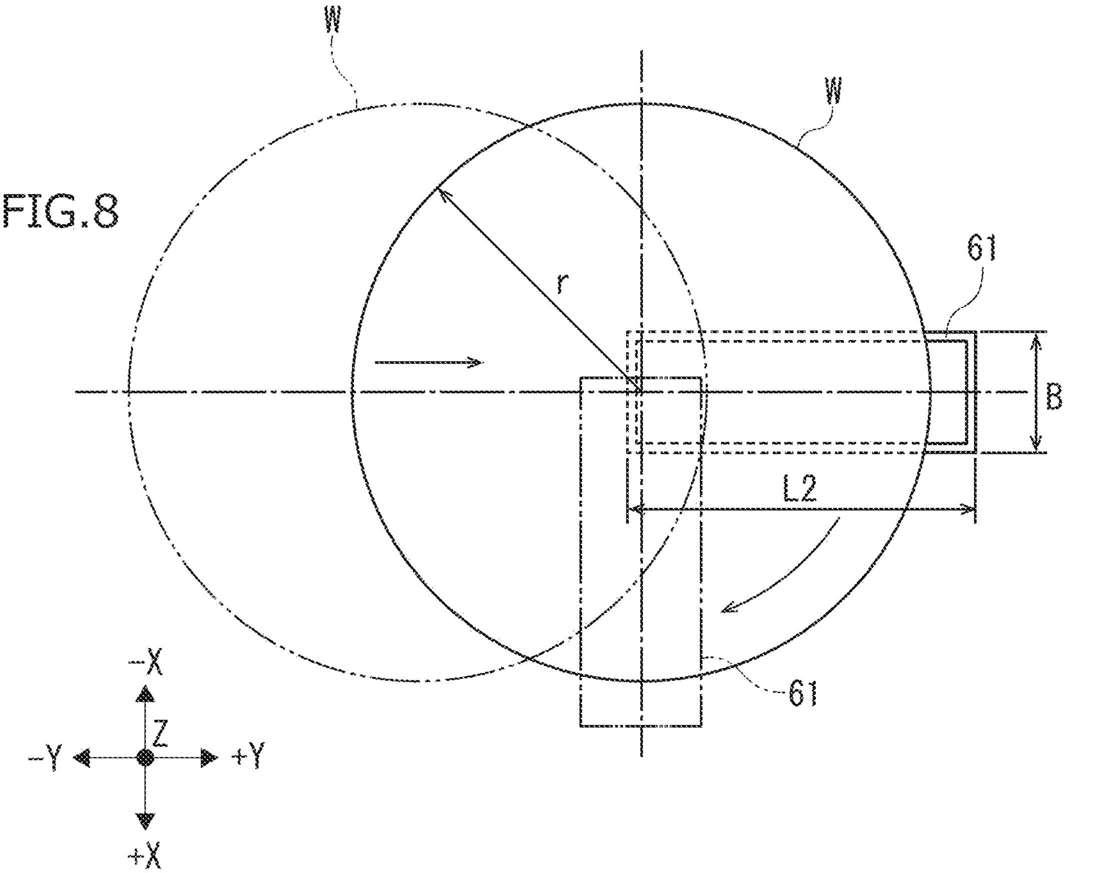
FIG. 8 is a plan view showing a method for cleaning a wafer using a wafer cleaning apparatus according to the other embodiment of the present invention.

FIG. 6 to FIG. 8 show a configuration of the main parts of the wafer cleaning apparatus of another embodiment. In this embodiment, a holding pad 51 supported at the distal end of an arm 53 extending horizontally is rotatable by a rotation mechanism about a vertical axis extending through the center of the holding pad 51. The rotation mechanism includes a motor 92 serving as a rotary drive source. This motor 92 is attached in a standing posture to the distal end of the arm 53 via a rotary joint 91. Further, the distal end of the arm 53 has a vertically extending spindle 68 inserted therethrough and rotatably supported. To the lower end of this spindle 68, the holding pad 51 is horizontally attached. Therefore, rotating this spindle 68 by the motor 92 in the direction of the arrow in FIG. 7 rotates the holding pad 51 attached to the lower end of the spindle 68 and the wafer W held by suction on the holding pad 51 in the same direction.

As shown in FIG. 6 and FIG. 7, the rotary joint 91 is connected to piping 56 via a plug 69. This piping 56 is connected to a suction source 57 via a shutoff valve V4. Further, in the center portion of the rotary joint 91, a suction path (not shown) is formed to extend in the vertical direction. This suction path is connected to the holding surface (under surface) of the holding pad 51. Therefore, by opening the shutoff valve V4 and connecting the suction surface of the holding pad 51 to the suction source 57, negative pressure is generated on the holding surface of the holding pad 51. This negative pressure draws the wafer W, resulting in the wafer W being held by suction onto the holding pad 51, as shown in FIG. 6 and FIG. 7.

In this embodiment, a cleaning tank 61 formed in the shape of a rectangular container with an open top is arranged in the Y direction. This cleaning tank 61 extends in the Y direction for a length L2 that is equal to or longer than the radius r of the wafer W (i.e., L2≥r). The inside of the cleaning tank 61 is filled with cleaning water supplied through the piping 65 from a cleaning water supply source 64. The top surface of this cleaning water is raised by surface tension, and is higher than the upper end of the cleaning tank 61, as shown in FIG. 7.

Also in this embodiment, a rectangular plate-like ultrasonic oscillator 63 is attached to the under surface of the cleaning tank 61. The ultrasonic oscillator 63 is electrically connected to a power supply 67 configured to apply high-frequency power to the ultrasonic oscillator 63.

When the wafer W is cleaned by the wafer cleaning apparatus configured as above, the holding pad 51 and the wafer W held thereon horizontally and linearly move in the Y direction by the Y-axis moving mechanism 80 from the position indicated by the two-dot chain lines in FIG. 7 and FIG. 8. Then, as shown by the solid lines in FIG. 7 and FIG. 8, while the holding pad 51 and the wafer W are positioned above the cleaning tank 61 and most of the cleaning tank 61 is covered by the wafer W, the Z-axis movement mechanism 90 descends the holding pad 51 and the wafer W so that the under surface of the wafer W partially contacts the cleaning water in the cleaning tank 61.

In this state, the motor 92 is activated to rotate the holding pad 51 together with the wafer W in the direction of the arrow in the figure. As a result, the partial contact of the under surface of the wafer W with the cleaning water in the cleaning tank 61 expands to cover the entire wafer W. As a result, the entire under surface of the wafer W is cleaned by the cleaning water, and the particles P adhered to the under surface are removed (see FIG. 7). That is, the under surface of the wafer W is swept by the cleaning tank 61 through the rotation of the wafer W, and the entire under surface of the wafer W is cleaned by the cleaning water. In this case, the cleaning water undergoes ultrasonic oscillation by the ultrasonic oscillator 63. Therefore, the particles P adhered to the under surface of the wafer W are effectively removed by the cleaning water undergoing ultrasonic oscillation.

Thus, in the wafer cleaning apparatus according to this embodiment, a part of the wafer W held on the holding pad 51 comes into contact with the cleaning water stored in the cleaning tank 61. Further, the contact of the wafer W with the cleaning water extends across the entire under surface of the wafer W due to the rotation of the wafer W. In other words, without immersing the entire wafer W held on the holding pad 51 in the cleaning water inside the cleaning tank 61, the entire under surface of the wafer W is cleaned by implementing the sweeping process across the wafer W by the cleaning tank 61 through rotation of the wafer W. Therefore, the width B of the cleaning tank 61 can be set to a minimum necessary value. Further, the length L2 of the cleaning tank 61 can be shortened to a slightly larger value than the radius r of the wafer W. Therefore, the cleaning tank 61 can be configured to be small and compact. As a result, the wafer cleaning apparatus can be downsized, and a processing apparatus such as a grinding apparatus in which this wafer cleaning apparatus is installed can also be downsized and made compact.

Note that the cleaning tank 61 of the present embodiment is arranged in the Y direction. The cleaning tank 61, however, may be arranged in X direction as indicated by the two-dot chain line in FIG. 8. This configuration also brings about the same effects described above.

In the above description, the wafer cleaning apparatuses of the embodiments are used for both cleaning the entire under surface of the wafer to be ground (pre-processing cleaning step) and for cleaning the entire under surface of the wafer after grinding (post-processing cleaning step). In this regard, it is possible to implement at least one of the pre-processing cleaning step and the post-processing cleaning step. Further, the above describes a grinding apparatus including a wafer cleaning apparatus of any of the embodiments. Regarding this, the wafer cleaning apparatus of any of the embodiments can be installed in any other processing apparatuses such as a polishing apparatus and a grinding apparatus, and can contribute to downsizing and making these processing apparatuses compact.

Further, the present invention is not limited to the embodiment described above, and various modifications may be made within the scope of the technical concept described in the claims, the specification, and the drawings.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A wafer cleaning apparatus, comprising:

a holding pad configured to hold a top surface of a wafer;

a cleaning mechanism configured to clean part of an under surface of the wafer held on the holding pad; and a moving mechanism configured to relatively move the holding pad and the cleaning mechanism in a horizontal direction, wherein the cleaning mechanism comprises:

a cleaning tank having an opening in its top surface and configured to store cleaning water therein so that the cleaning water rises higher than the opening by surface tension of the surface of the cleaning water;

a cleaning water supply configured to supply cleaning water to the cleaning tank; and an ultrasonic oscillator arranged at the cleaning tank and configured to propagate ultrasonic oscillation to the cleaning water; and wherein the moving mechanism is configured to move the holding pad holding the wafer, whose under surface is partially in contact with the cleaning water raised higher than the opening of the cleaning tank, so as to clean the under surface of the wafer by the ultrasonic oscillation propagated through the cleaning water from the ultrasonic oscillator.

2. The wafer cleaning apparatus as set forth in claim 1, wherein:

the moving mechanism is configured to move the holding pad horizontally along a linear or arc-shaped motion path; and the cleaning tank extends for a length equal to or longer than the diameter of the wafer, in a direction intersecting with the motion path of the holding pad.

3. The wafer cleaning apparatus as set forth in claim 1, wherein:

the moving mechanism is configured to rotate the holding pad about an axis passing through the center of the holding pad; and the cleaning tank extends for a length equal to or longer than the radius of the wafer.

4. A processing apparatus, comprising:

a chuck table configured to hold a wafer;

a processing unit configured to process the wafer held on the chuck table; and the wafer cleaning apparatus comprising, a holding pad configured to hold a top surface of the wafer;

a cleaning mechanism configured to clean part of an under surface of the wafer held on the holding pad; and a moving mechanism configured to relatively move the holding pad and the cleaning mechanism in a horizontal direction, wherein the cleaning mechanism comprises:

a cleaning tank having an opening in its top surface and configured to store cleaning water therein so that the cleaning water rises higher than the opening by surface tension of the surface of the cleaning water;

a cleaning water supply configured to supply cleaning water to the cleaning tank; and an ultrasonic oscillator arranged at the cleaning tank and configured to propagate ultrasonic oscillation to the cleaning water; and wherein the moving mechanism is configured to move the holding pad holding the wafer, whose under surface is partially in contact with the cleaning water raised higher than the opening of the cleaning tank. so as to clean the under surface of the wafer by the ultrasonic oscillation propagated through the cleaning water from the ultrasonic oscillator, wherein the wafer cleaning apparatus is configured to clean at least one of the under surface of a wafer held on the holding pad before processing and the under surface of the wafer held on the holding pad after processing by the processing unit.

5. A processing method of a wafer using the processing apparatus of claim 4, comprising:

a processing step of processing the wafer held on the chuck table by the processing unit, and at least one of a pre-processing cleaning step of cleaning the under surface of the wafer held on the holding pad by the wafer cleaning apparatus before the processing step and a post-processing cleaning step of holding the wafer having been processed in the processing step on the holding pad and cleaning the under surface of the wafer by the wafer cleaning apparatus.

6. The wafer cleaning apparatus as set forth in claim 1, wherein the ultrasonic oscillator is attached to an under surface of the cleaning tank.

* * * * *